United States Patent
Ahn et al.

(10) Patent No.: US 7,358,155 B2
(45) Date of Patent: Apr. 15, 2008

(54) SCRIBE-LINE STRUCTURES AND METHODS OF FORMING THE SAME

(75) Inventors: Jeong-Hoon Ahn, Guachon-si (KR); Heon-Jong Shin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 58 days.

(21) Appl. No.: 11/335,359

(22) Filed: Jan. 19, 2006

(65) Prior Publication Data

US 2006/0163701 A1 Jul. 27, 2006

(30) Foreign Application Priority Data

Jan. 25, 2005 (KR) ...................... 10-2005-0006848

(51) Int. Cl.
*H01L 21/00* (2006.01)
(52) U.S. Cl. ............... 438/462; 257/E21.599; 257/E21.602; 257/E21.606
(58) Field of Classification Search ................ 257/660, 257/662; 438/33, 462
See application file for complete search history.

(56) References Cited

U.S. PATENT DOCUMENTS

| | | | | |
|---|---|---|---|---|
| 5,686,171 | A * | 11/1997 | Vokoun et al. ............. | 428/209 |
| 5,795,815 | A * | 8/1998 | Vokoun et al. ............. | 438/462 |
| 5,943,591 | A * | 8/1999 | Vokoun et al. ............. | 438/462 |
| 6,335,559 | B1 * | 1/2002 | Charles ....................... | 257/620 |
| 6,383,893 | B1 * | 5/2002 | Begle et al. ................. | 438/460 |
| 6,441,465 | B2 | 8/2002 | Lin et al. .................... | 257/620 |
| 6,897,127 | B2 * | 5/2005 | Hanaoka ..................... | 438/460 |
| 6,939,777 | B2 * | 9/2005 | Ohto et al. .................. | 438/401 |
| 2005/0139964 | A1 * | 6/2005 | Ando ........................... | 257/620 |
| 2005/0233549 | A1 * | 10/2005 | Eshleman .................... | 438/462 |
| 2006/0141750 | A1 * | 6/2006 | Suzuki et al. ............... | 438/460 |

FOREIGN PATENT DOCUMENTS

| | | | |
|---|---|---|---|
| JP | 358089841 A | * | 5/1983 |
| KR | 10-1998-085821 | | 12/1998 |
| KR | 10-1999-008510 | | 2/1999 |
| KR | 10-2004-0003319 | | 1/2004 |

* cited by examiner

*Primary Examiner*—David A Zarneke
(74) *Attorney, Agent, or Firm*—Mills & Onello LLP

(57) ABSTRACT

Scribe-line structures and methods of forming such scribe-line structures on a face of a semiconductor substrate are provided. By means of the scribe-line structures and the methods of this invention, physical shock and cracking tendencies along a semiconductor substrate can be minimized during performance of a cutting process on the semiconductor substrate as part of post-fabrication processing. A representative method according to this invention comprises the sequential steps of: forming a lower layer on a semiconductor substrate; forming a molding layer on the lower layer such that the molding layer includes at least one protective contact hole; subsequently forming a dielectric layer and an upper layer on the molding layer so as to fill the protective contact hole, such dielectric layer being formed of a material having a greater mechanical intensity than that of the molding layer; and then forming protective layer patterns on the upper layer.

18 Claims, 11 Drawing Sheets

SCRIBE-LINE STRUCTURES AND METHODS OF FORMING THE SAME

CROSS-REFERENCE TO RELATED PATENT APPLICATION

This patent application claims priority from Korean Patent Application No. 10-2005-0006848, filed Jan. 25, 2005, the contents of which are hereby incorporated by reference in their entirety.

BACKGROUND OF THE INVENTION

1. Field of the Invention

The present invention relates to structures formed on a semiconductor substrate and to methods of forming the same, and more particularly, to scribe-line structures formed on a semiconductor substrate, to substrates having such scribe-line structures, and to methods of forming the same.

2. Description of the Related Art

Generally, multiple semiconductor devices are formed respectively on predetermined regions of a semiconductor substrate. Each of these regions may be defined by a set of intersecting scribe-lines, for example by horizontal and vertical scribe-lines. Each such scribe-line has a predetermined width, so that the semiconductor substrate can be easily cut along the scribe-lines so as to separate the individual semiconductor devices from each other and from any unused portions of the semiconductor substrate. Before performing the cutting process described above, the semiconductor devices and the scribe-lines are typically covered with a plurality of interlayer insulating layers. The interlayer insulating layers protect the semiconductor devices from exterior environment influences while cutting the semiconductor substrate.

But, in recent manufacturing operations in this field, it has been found that it is often necessary to replace each of the interlayer insulating layers used to protect the formed semiconductor devices with other materials having lower dielectric constants to avoid interfering with the higher-speed operation of modern semiconductor devices. A common characteristic of such materials having a lower dielectric constant, however, is that the mechanical intensity of these materials is often lower than that of silicon oxide ($SiO_2$). As a result, such materials having a lower dielectric constant are readily subject to physical shock and have a tendency to crack along or adjacent to the semiconductor devices during the step of performing the cutting process along the scribe-lines.

In one approach to these familiar problems, U.S. Pat. No. 6,441,465 to Chi-Fa Lin (the '465 patent), which is incorporated herein by reference, discloses a scribe line structure for preventing the type of damages as described above that may be induced during fabrication processes. According to the '465 patent, the scribe-line structure intentionally includes cavities disposed in a multi-layer structure along a scribe-line. The cavities are disposed on each side of a scribe-line and then disposed in at least two rows. The '465 patent teaches that such cavities reduce and relieve internal stress of the scribe lines, which may be created during formation of the scribe-line and thus reduce the tendency for crack formation, peeling, delamination and dielectric fracture of the scribe lines during cutting of the substrate.

However, the scribe-line structure taught by the '465 patent also can cause damage to the semiconductor devices because the cavities act as starting points for a crack during performing a cutting process along a scribe-line. Besides, the cavities also act as obstructions while performing the cutting process along the scribe-line, so that the processing time may be made longer than would otherwise be required.

These and other problems with or limitations of the prior art techniques in this field are addressed in whole, or at least in part, by the structures and methods of this invention.

SUMMARY OF THE INVENTION

According to one embodiment of the present invention, there are provided scribe-line structures on a semiconductor substrate such that during performance of a cutting process on the semiconductor substrate, physical shock and cracking tendencies on the one or more semiconductor devices formed on the substrate can be minimized.

According to another embodiment of the present invention, there are provided methods of forming scribe-line structures such that during performance of a cutting process on a semiconductor substrate having such scribe-line structures thereon, physical shock and cracking tendencies on the semiconductor devices formed on the substrate can be minimized.

To accomplish the objects described above and other related objectives, the present invention provides new types of scribe-line structures and methods of forming such scribe-line structures.

One embodiment of scribe-line structures according to this invention comprises a lower layer disposed on a semiconductor substrate. A molding layer having at least one protective contact hole is then disposed on the lower layer. A dielectric layer and an upper layer are thereafter disposed in sequence on the molding layer so as to fill the protective contact hole(s). On the upper layer, protective layer patterns are then disposed so as to be spaced a distance away from each other. The spacing distance between the protective layer patterns should be different in size from a width of the protective contact hole(s). Also, the dielectric layer should be formed of a material having a greater mechanical intensity (or strength) than that of the molding layer.

Another embodiment of scribe-line structures according to this invention comprises a lower layer disposed on a semiconductor substrate. A pad layer and a molding layer having at least one protective contact hole are then disposed on the lower layer in sequence. A dielectric layer and an upper layer are thereafter disposed in sequence on the molding layer so as to fill the protective contact hole(s). On the upper layer, protective layer patterns are then disposed so as to be spaced a distance away from each other. The spacing distance between the protective layer patterns should be different in size from a width of the protective contact hole(s). Also, the dielectric layer and the pad layer should be formed of a material or of materials having a greater mechanical intensity (or strength) than that of the molding layer.

Still another embodiment of scribe-line structures according to this invention comprises a lower layer and a pad layer disposed in order on a semiconductor substrate. A molding layer having at least one protective contact hole is then disposed on the pad layer. A dielectric layer and an upper layer are thereafter disposed in sequence on the molding layer so as to fill the protective contact hole(s). On the upper layer, protective layer patterns are then disposed so as to be spaced a distance away from each other. The spacing distance between the protective layer patterns should be different in size from a width of the protective contact hole(s). Also, the dielectric layer and the pad layer should be formed of a material or of materials having a greater mechanical intensity (or strength) than that of the molding layer.

One embodiment of a method of forming scribe-line structures according to this invention comprises the initial steps of forming a lower layer and a molding layer on a semiconductor substrate in sequence. A photoresist layer is then formed on the molding layer. The photoresist layer is formed so as to have at least one opening extending down to the molding layer. The molding layer is then etched through the opening(s) using the photoresist layer as an etching mask. The etching process forms one or more protective hole(s) in the molding layer to expose the lower layer. The photoresist layer is thereafter removed from the semiconductor substrate. On the molding layer, a dielectric layer, an upper layer, and a set of protective layer patterns are then formed in sequence so as to fill the protective hole(s). The dielectric layer should be formed using a material having a greater mechanical intensity (strength) than that of the molding layer.

Another embodiment of a method of forming scribe-line structures according to this invention comprises the initial steps of forming a lower layer, a pad layer, and a molding layer on a semiconductor substrate in sequence. A photoresist layer is then formed on the molding layer. The photoresist layer is formed so as to have at least one opening extending down to the molding layer. The molding layer and the pad layer are then etched in sequence through the opening(s) using the photoresist layer as an etching mask. The etching process forms one or more protective hole(s) in the pad layer and the molding layer to expose the lower layer. The photoresist layer is thereafter removed from the semiconductor substrate. On the molding layer, a dielectric layer, an upper layer, and a set of protective layer patterns are then formed in sequence so as to fill the protective hole(s). The dielectric layer and the pad layer should be formed using a material or materials having a greater mechanical intensity (strength) than that of the molding layer.

Still another embodiment of a method of forming scribe-line structures according to this invention comprises the initial steps of forming a lower layer, a pad layer, and a molding layer on a semiconductor substrate in order. A photoresist layer is then formed on the molding layer. The photoresist layer is formed so as to have at least one opening extending down to the molding layer. The molding layer is then etched through the opening(s) using the photoresist layer as an etching mask. The etching process forms one or more protective hole(s) in the molding layer and the pad layer to expose the lower layer. The photoresist layer is thereafter removed from the semiconductor substrate. On the molding layer, a dielectric layer, an upper layer, and a set of protective layer patterns are then formed in sequence so as to fill the protective hole(s). The dielectric layer and the pad layer should be formed using a material or materials having a greater mechanical intensity (strength) than that of the molding layer.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts or elements. In the drawings.

DETAILED DESCRIPTION OF THE INVENTION

Figure 1:
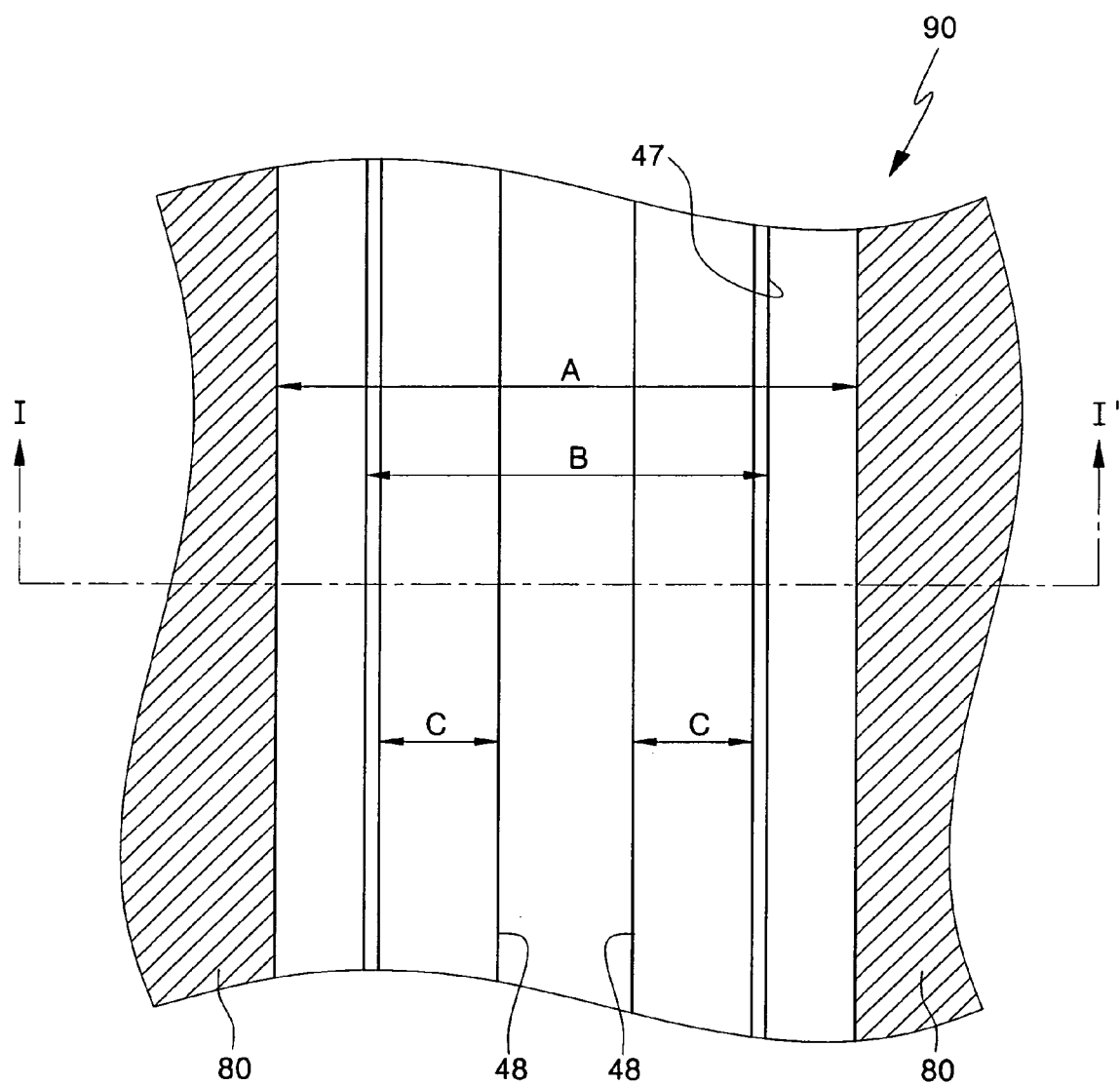
FIG. 1 is a schematic layout diagram illustrating scribe-line structures formed along a face of a semiconductor substrate having at least a semiconductor device thereon, the scribe-line structures being formed according to the present invention.
Figure 2:
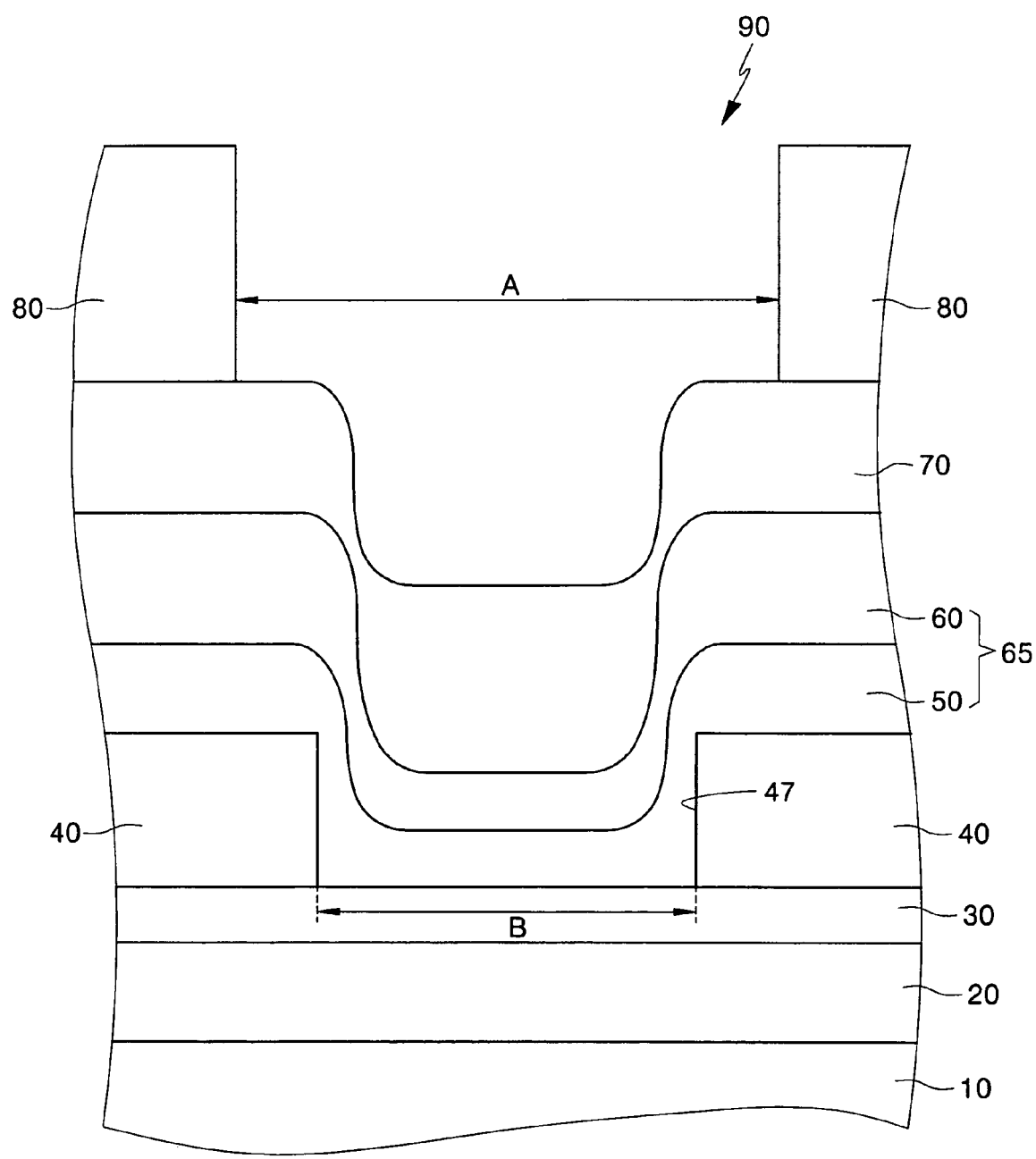
FIGS. 2 and 3 are two schematic cross-sectional views, each of a different scribe-line structure as seen in FIG. 1, taken along the section line I-I' of FIG. 1, respectively.
Figure 3:
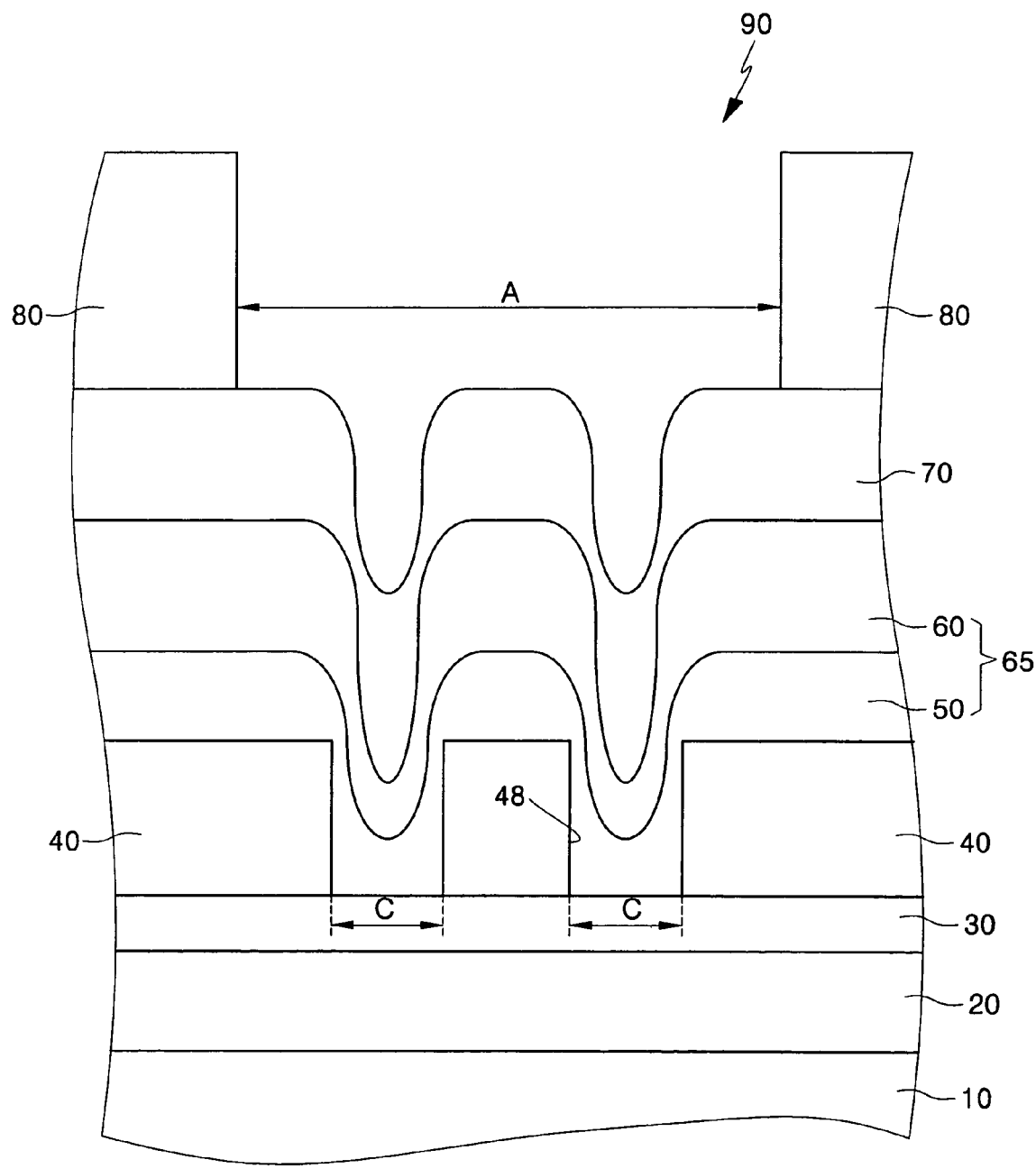

FIG. 1 is a schematic layout diagram illustrating scribe-line structures formed along a semiconductor substrate having at least a semiconductor device thereon, the scribe-line structures being formed according to the present invention, and FIGS. 2 and 3 are schematic cross-sectional views of two different scribe-line structures as seen in FIG. 1 taken along the section line I-I' of FIG. 1, respectively.

Referring to FIGS. 1 to 3, a lower layer 20 and a pad layer 30 are sequentially disposed on a semiconductor substrate 10. A molding layer 40 is disposed on the pad layer 30. The molding layer 40 has a first protective contact hole 47 (as seen in FIG. 2) or alternatively has first and second protective contact holes 48 (as seen in FIG. 3), or, as shown in FIG. 1, both. The first protective contact hole 47 and/or the first and second protective contact holes 48 may be surrounded with the molding layer 40 along the sides and the pad layer 30 along the bottom(s) thereof. In some invention embodiments, however, the pad layer 30 may not be disposed between the molding layer 40 and the lower layer 20. In this case, the first protective contact hole 47 and/or the first and second protective contact holes 48 may be surrounded with the molding layer 40 along the sides and the lower layer 20 along the bottom(s) thereof. It is desirable that the lower layer 20 consist essentially of a material having a greater mechanical intensity (strength) than that of either the pad layer 30 or the molding layer 40. The lower layer 20 may, for example, be formed of silicon oxide ($SiO_2$).

At the same time, the molding layer 40 should preferably consist essentially of a material having a lower mechanical intensity (strength) than that of the pad layer 30. It is especially desirable that the pad layer 30 be formed of what will herein be called a "low-k material," for example a material selected from the group consisting of the substances commonly known in the trade as Black Diamond, Coral, Aurora, and materials having dielectric constants similar thereto. For some invention embodiments, the pad layer 30 and the molding layer 40 may alternatively be formed of what will herein be called a "lower-k material," for example a material selected from the group consisting of the substances commonly known in the trade as Nanoporous silicate, BCB, Flare, ALCAP, LKD, and materials having dielectric constants similar thereto. For some invention embodiments, the molding layer 40 may be composed of a compositie of two or more low-k materials. For some invention embodiments, the pad layer 30 may also be composed of a compositie of two or more of the previously mentioned low-k materials or of two or more of the previously mentioned lower-k materials. It is also desirable in accordance with this invention that a set of the protective hole(s), such as first protective contact hole 47, be disposed along a scribe-line 90 of FIG. 1 to form a trench as shown in FIG. 2. The trench has a predetermined contact hole width B. It is similarly desirable that a set of the first and second protective contact holes 48 be disposed along the scribe-line 90 of FIG. 1 to form two trenches as shown in FIG. 3. Each of the first and second protective contact holes 48 in FIG. 3 defines a trench with a predetermined contact hole width C.

A base layer 50, a buried layer 60, and an upper layer 70 may be sequentially disposed on the molding layer 40 so as to fill the first protective contact hole 47 (FIG. 2) and/or the first and second protective contact holes 48 (FIG. 3). It is particularly desirable that the upper layer 70 be formed of silicon nitride ($Si_3N_4$). It is also desirable that the buried layer 60 and the base layer 50 be formed of a material or materials having a lower mechanical intensity (strength) than that of the lower layer 20. It is particularly desirable, for example, that the base layer 50 and the buried layer 60 consist essentially of a low-k material selected from the group consisting of Black Diamond, Coral, Aurora, or materials having dielectric constants similar thereto. In another invention embodiment, the base layer 50 may be a low-k material selected from the group consisting of Black Diamond, Coral, Aurora, or materials having dielectric constants similar thereto, while the buried layer 60 may be a lower-k material selected from the group consisting of Nanoporous silicate, BCB, Flare, ALCAP, LKD, or materials having dielectric constants similar thereto. Also, the base layer 50 may be lower-k material comprising Nanoporous silicate, BCB, Flare, ALCAP, LKD, or materials having dielectric constants similar thereto, while the buried layer 60 may be a low-k material selected from the group consisting of Black Diamond, Coral, Aurora, or materials having dielectric constants similar thereto. Hereinafter, the combination of base layer 50 and buried layer 60, or, if only one is present, the one layer, will be referred to as dielectric layer 65. Thus, the dielectric layer 65 may comprise either the buried layer 60 or the base layer 50. The dielectric layer 65 may also be composed of two or more low-k materials. Alternatively, the dielectric layer 65 may be composed of a combination of two or more low-k materials and also of two or more lower-k materials, said material layers being stacked in turn.

Protective layer patterns 80 are shown disposed on the upper layer 70. It is desirable that the protective layer patterns 80 be disposed so as to be spaced a distance away from each other. As seen in FIG. 2 and FIG. 3 respectively, a spacing distance A between the protective layer patterns 80 is different from either the contact hole width B of the first protective contact hole 47 (FIG. 2) or the contact hole width C of each of the first and second protective contact holes 48 (FIG. 3). It is particularly desirable that the protective layer patterns 80 be formed of polyimide.

FIGS. 4 to 11 are schematic cross-sectional views, taken along the section line I-I' of FIG. 1, illustrating sequential steps in two methods according to the present invention of forming scribe-line structures on a semiconductor substrate.

Figure 4:
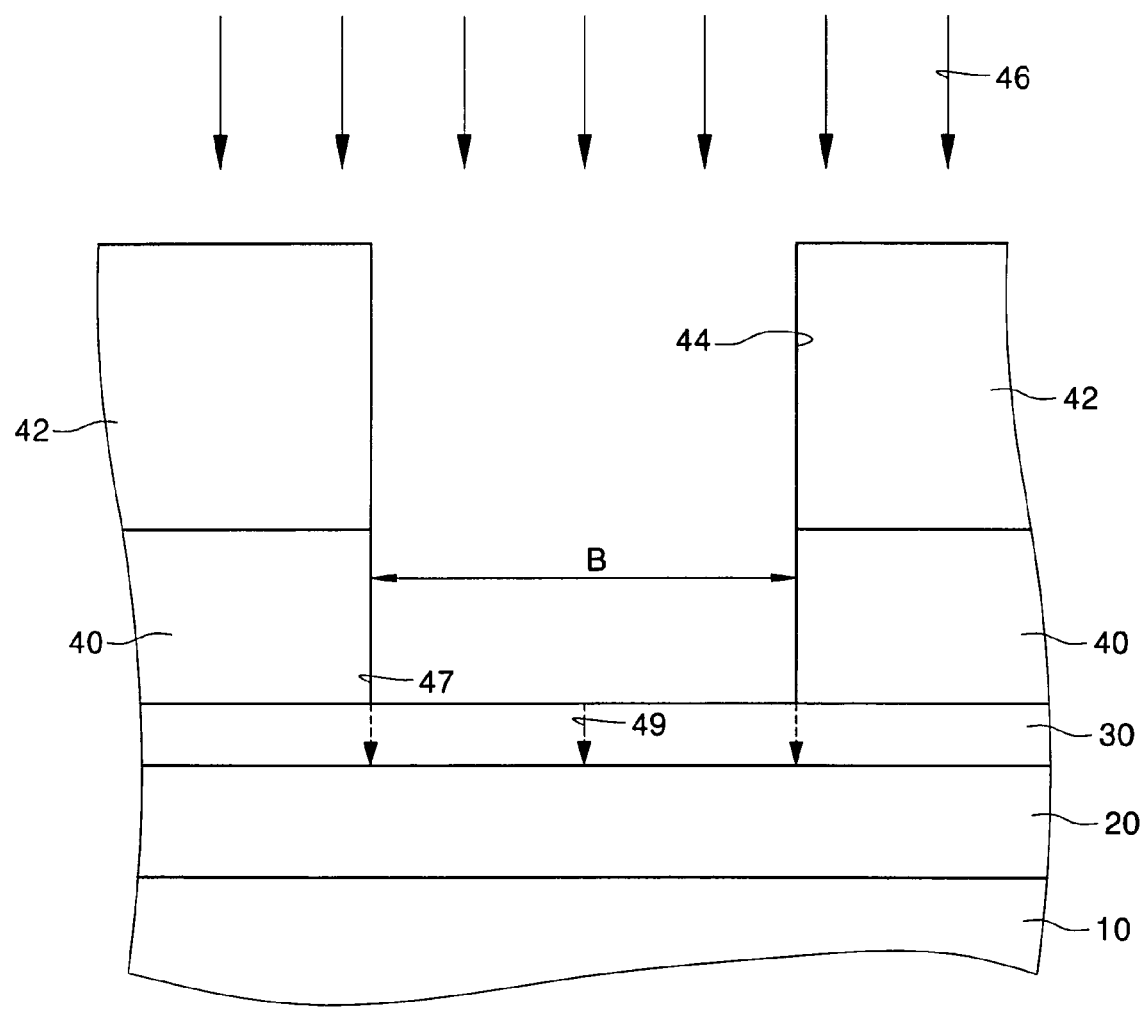
FIGS. 4 to 11 are schematic cross-sectional views, taken along the section line I-I' of FIG. 1, illustrating the sequential steps in two methods of forming scribe-line structures according to the present invention.
Figure 5:
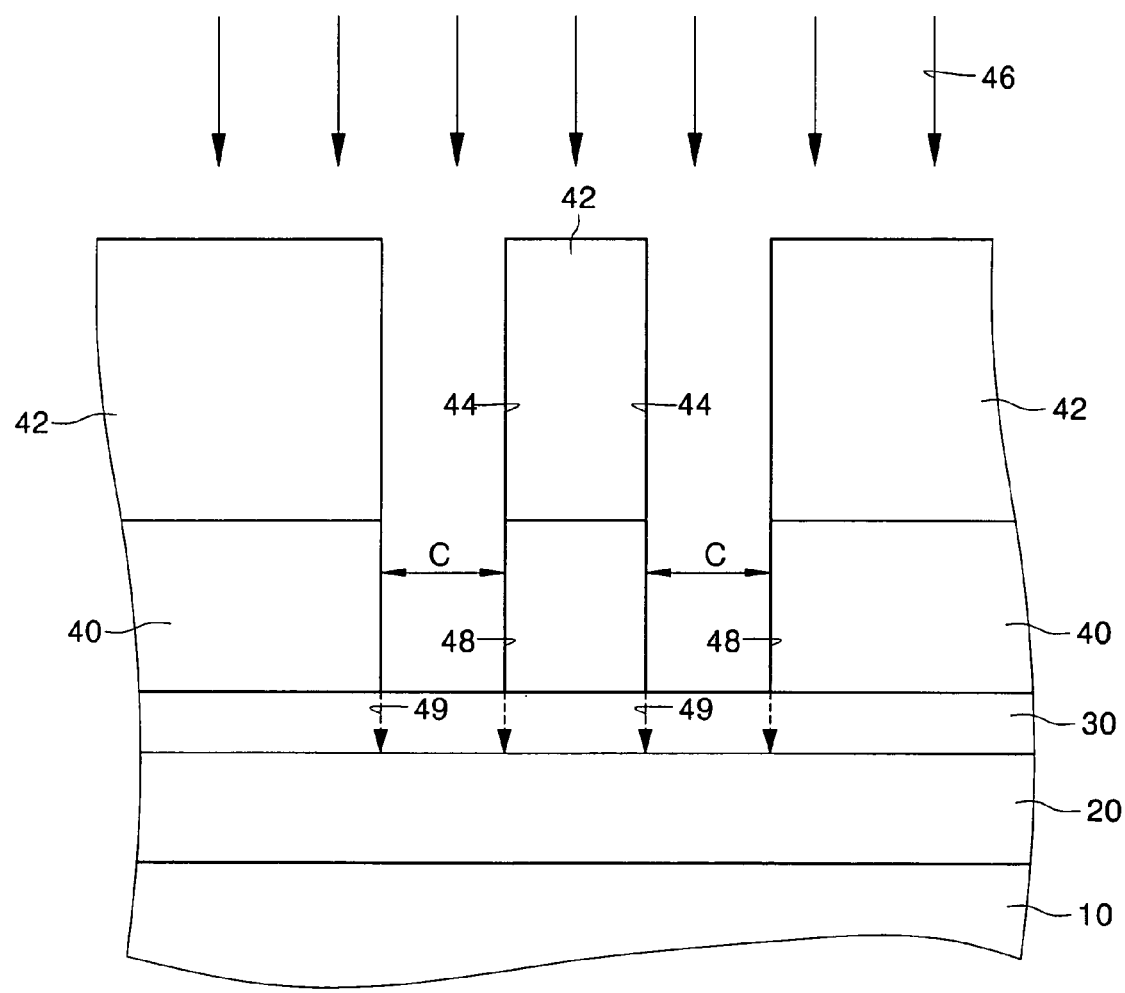

Referring to FIGS. 1, 4, and 5, a lower layer 20 and a pad layer 30 are sequentially formed on a semiconductor substrate 10. A molding layer 40 and a photoresist layer 42 are then formed so as to be sequentially stacked on the pad layer 30. The photoresist layer 42 is formed to have at least one opening, for example the single opening 44 in FIG. 4 and/or the two openings 44 seen in FIG. 5. An etching process 46 is then performed on the molding layer 40 through the one or more openings 44 using the photoresist layer 42 as an etching mask. The etching process (represented by the arrows 46) forms a first protective contact hole 47 as shown in FIG. 4 or, alternatively, first and second protective contact holes 48 as shown in FIG. 5, in the molding layer 40. The first protective contact hole 47 or the first and second protective contact holes 48 are formed so as to expose the pad layer 30.

In accordance with this invention, it is desirable that the first protective contact hole 47 be formed so as to extend a trench having a predetermined width B along a scribe-line 90 as shown in FIG. 1. Alternatively (or, additionally), the scribe-line 90 may be formed to have the first and second protective contact holes 48. The first and second protective contact holes 48 are preferably formed so as to extend each of two trenches, each having a predetermined width C, along the scribe-line 90 as shown in FIG. 1.

The first and second protective contact holes 48 (FIG. 5) or the first protective contact hole 47 (FIG. 4) may be repeatedly formed along a double (FIG. 5) or a single (FIG. 4) line 49 in a linear sequence to penetrate both the molding layer 40 and the underlying pad layer 30. As noted above, the first protective contact hole 47 or the first and second protective contact holes 48 are formed to a suitable depth so as to expose the lower layer 20. In some invention embodiments, the pad layer 30 may not be formed between the molding layer 40 and the lower layer 20. In this case, the first protective contact hole 47 or the first and second protective contact holes 48 are formed to a suitable depth so as to expose the lower layer 20 through the molding layer 40.

It is desirable that the lower layer-20 be formed by using a material having a greater mechanical intensity (strength) than that of either the pad layer 30 or the molding layer 40. In one preferred embodiment, the lower layer 20 can be formed using silicon oxide ($SiO_2$). In another preferred embodiment, the molding layer 40 may be formed by using material having a lower mechanical intensity (strength) than that of the pad layer 30. In one invention embodiment, the pad layer 30 can be formed by using a low-k material selected from the group consisting of Black Diamond, Coral, Aurora, and materials having dielectric constants similar thereto. In another invention embodiment, the pad layer 30 and the molding layer 40 may both be formed by using a lower-k material selected from the group consisting of Nanoporous silicate, BCB, Flare, ALCAP, LKD, and materials having dielectric constants similar thereto. The molding layer 40 may also be composed of two or more lower-k materials. In yet another embodiment, the pad layer 30 may be formed of two or more of the previously described low-k materials or of two or more of the previously described lower-k materials.

After the formation of the first protective contact hole 47 and/or of the first and second protective contact holes 48, the photoresist layer 42 is removed from the semiconductor substrate 10 by methods well known in the art.

Figure 6:
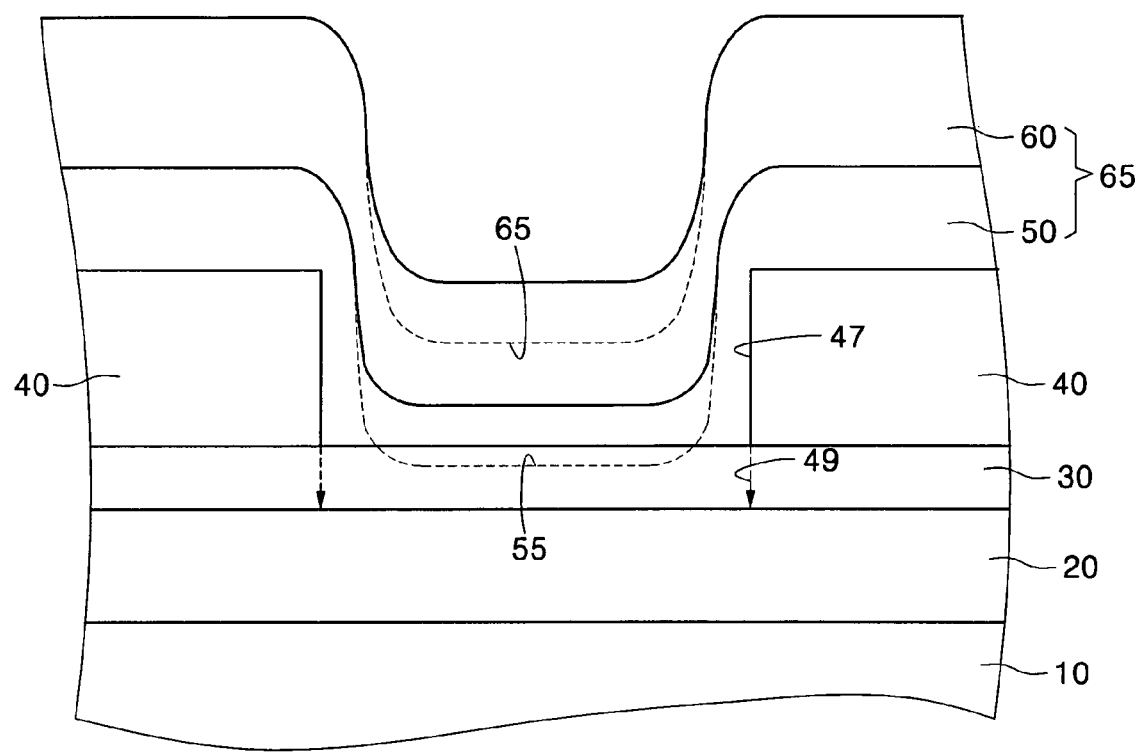
Figure 7:
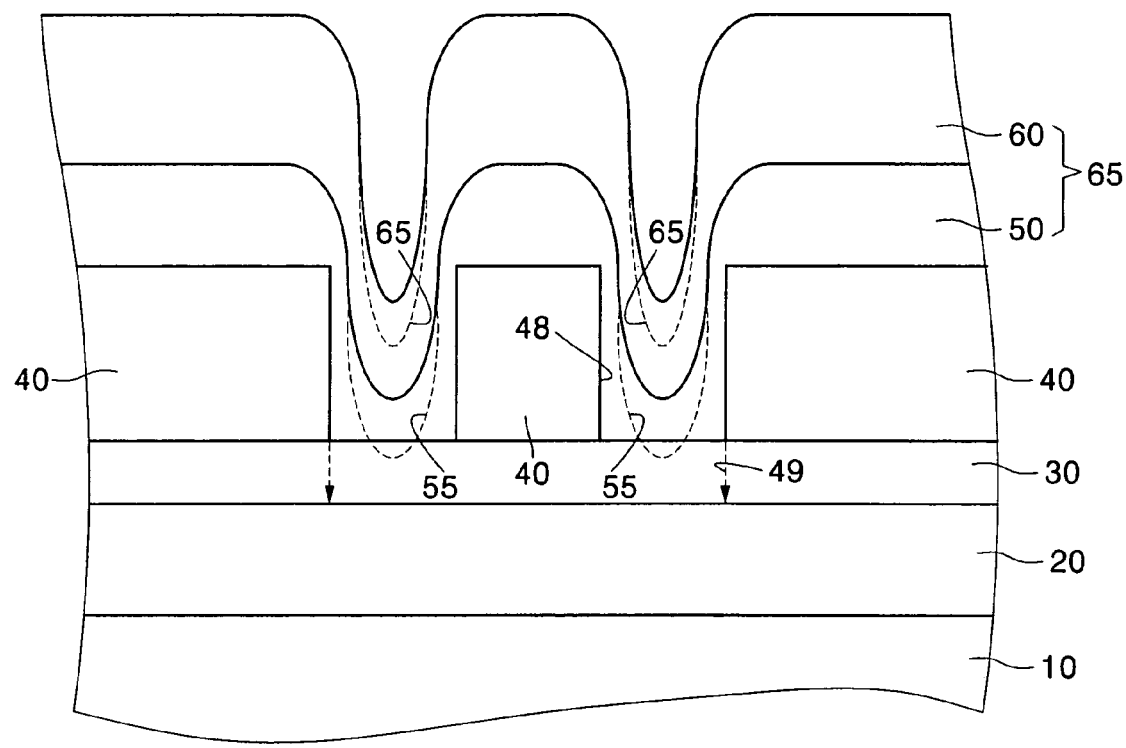
Figure 8:
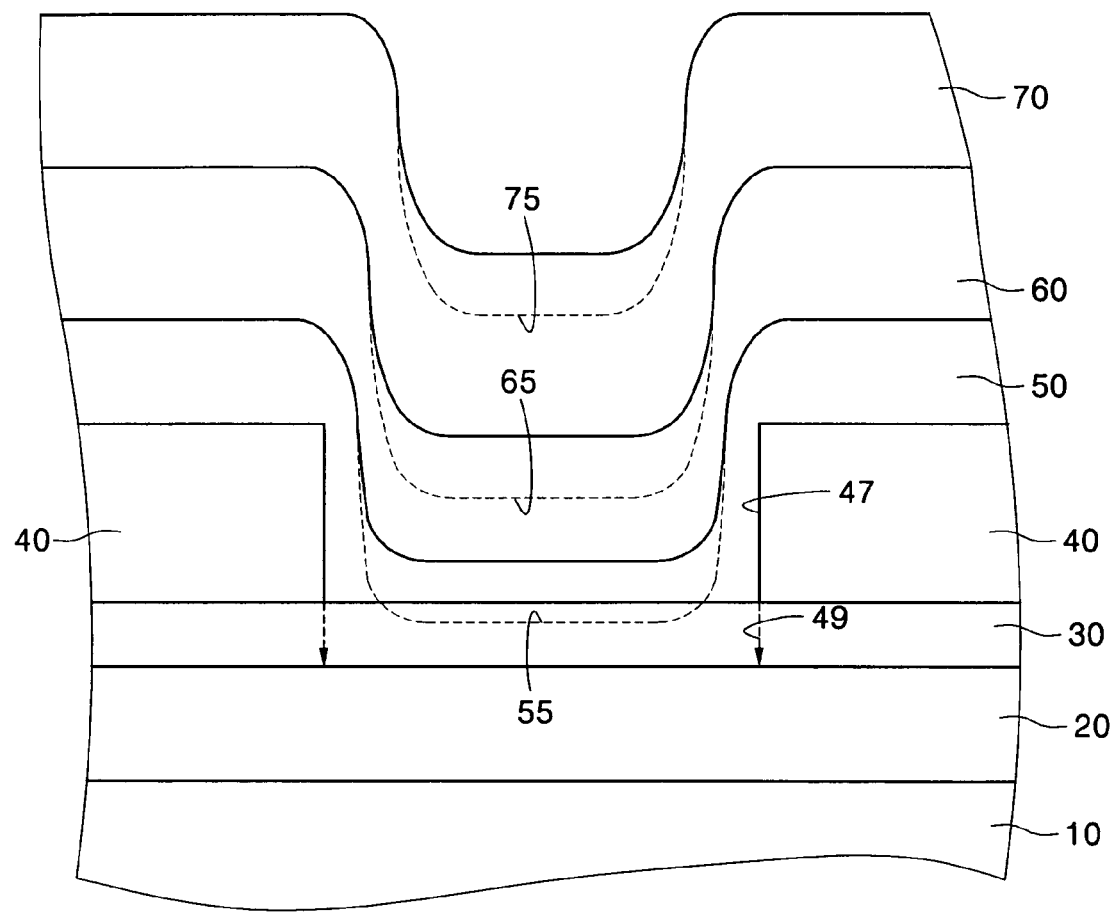
Figure 9:
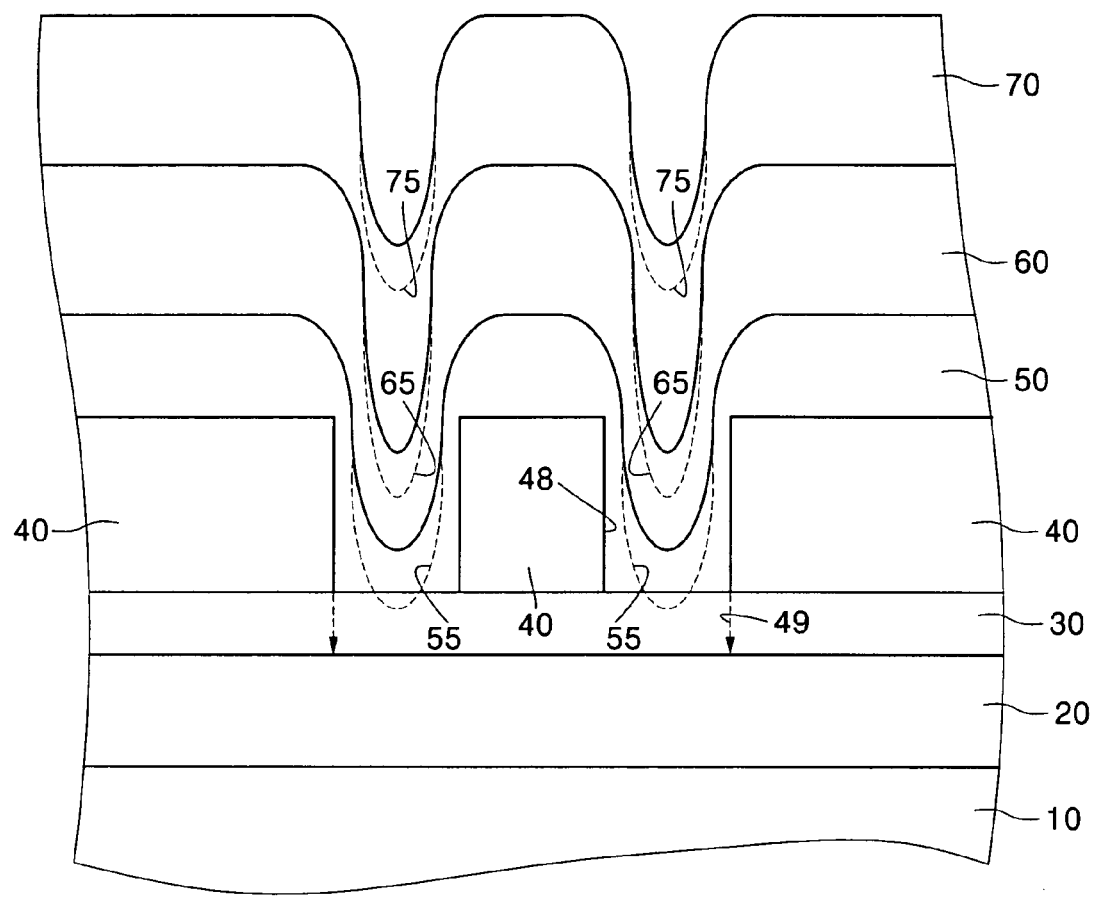

Referring now to FIGS. 1, 6, and 7, a portion or portions of the pad layer 30 is (are) exposed through the first protective contact hole 47 and/or the first and second protective contact holes 48, a dielectric layer 65 may be formed on the exposed portions of pad layer 30 and on the molding layer 40 so as to fill the first protective contact hole 47 or the first and second protective contact holes 48. It is often desirable that the dielectric layer 65 be formed by using a base layer 50 and a buried layer 60 which are stacked in sequence. The dielectric 65 may also be formed, however, by only using the base layer 50 or only using the buried layer 60.

The buried layer 60 and the base layer 50 are preferably formed by using a material or materials having a greater mechanical intensity (strength) than that of the molding layer 40. It is also often desirable that the buried layer 60 and the base layer 50 be formed by using a low-k material selected from the group consisting of Black Diamond, Coral, Aurora, and materials having dielectric constants similar thereto. In an alternative embodiment, the base layer 50 may be formed by using a low-k material selected from the group consisting of Black Diamond, Coral, Aurora, and materials having dielectric constants similar thereto, while the buried layer 60 is formed by using a lower-k material selected from the group consisting of Nanoporous silicate, BCB, Flare, ALCAP, LKD, and materials having dielectric constants similar thereto. Alternatively, the base layer 50 may be formed by using a lower-k material selected from the group consisting of Nanoporous silicate, BCB, Flare, ALCAP, LKD, and materials having dielectric constants similar thereto, while the buried layer 60 is formed by using a low-k material selected from the group consisting of Black Diamond, Coral, Aurora, and materials having dielectric constants similar thereto. The dielectric layer 65 may also be formed of two or more low-k materials. Furthermore, the dielectric layer 65 may additionally be formed of two or more low-k materials and two or more lower-k materials, as described above, stacked in turn.

In the case where a portion or portions of the lower layer 20 is (are) exposed through the first protective contact hole 47 or through the first and second protective contact holes 48, the base layer 50 and the buried layer 60 may be formed on the exposed portions of lower layer 20 and on the molding layer 40 so as to fill the first protective contact hole 47 or the first and second protective contact holes 48. At this time, the base layer 50 and the buried layer 60 may be formed to have top surfaces as generally indicated by dotted lines 55 and 65, respectively, as shown in FIGS. 6 and 7.

The buried layer 60 and the base layer 50 should have a greater mechanical intensity (strength) than that of the molding layer 40, so that, during performance of a cutting process on the semiconductor substrate 10 along a scribe-line 90, physical shock to the molding layer 40 can be minimized. As a result, the base layer 50 and the buried layer 60 can reduce the number of crack occurrences during cutting along the scribe-line. Furthermore, because the first and second protective contact holes 48 use the molding layer 40 as a shielding layer against physical shock in a central area of the first protective contact hole 47, crack transference to a peripheral area of the scribe-line 90 can also be minimized.

Referring now to FIGS. 1 and 8 to 11, in the case where the pad layer 30 is exposed through the first protective contact hole 47 or through the first and second protective contact holes 48, an upper layer 70 may be formed on the dielectric layer 65. The upper layer 70 may be conformally formed along the top surface of the dielectric layer 65. The upper layer 70 may be formed, for example, using silicon nitride ($Si_3N_4$). In the case where the lower layer 20 is exposed through the first protective contact hole 47 or through the first and second protective contact holes 48, the upper layer 70 can be conformally formed to have a top surface generally indicated by dotted line 75 of FIG. 8 or FIG. 9.

Figure 10:
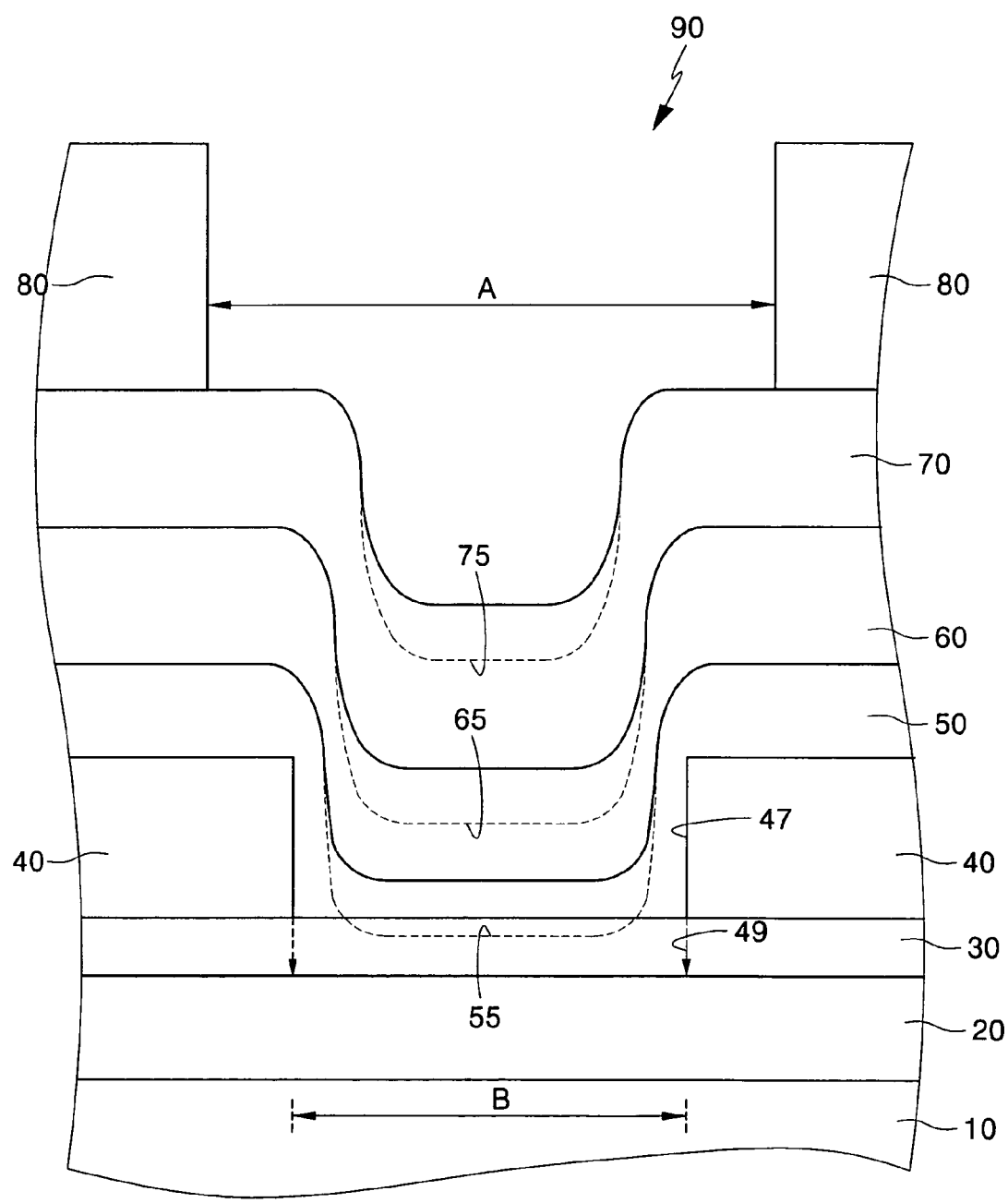
Figure 11:
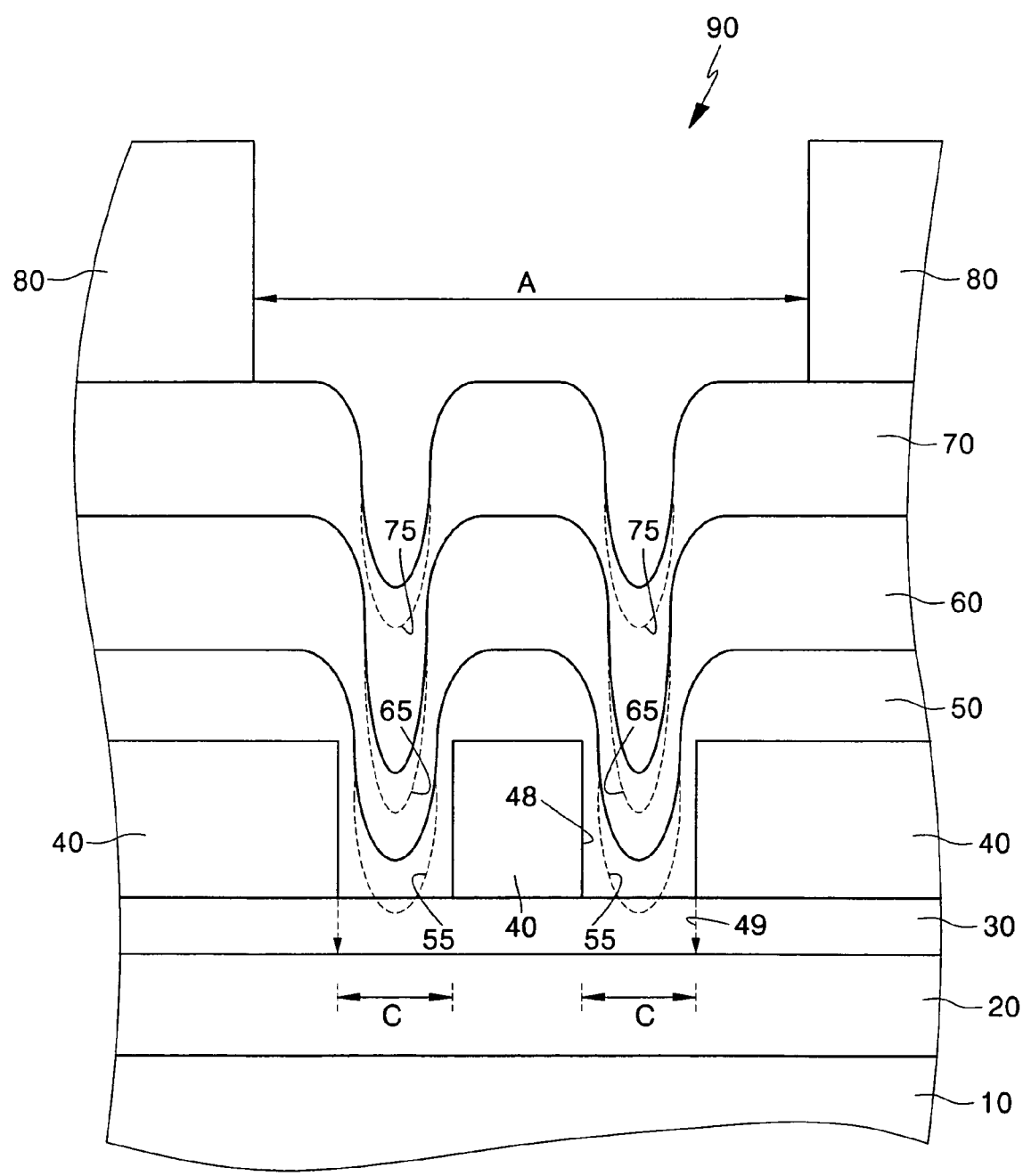

Protective layer patterns 80 may then be formed on the upper layer 70. The protective layer patterns 80 are preferably formed so as to be spaced a distance away from each other. It is desirable that the spacing distance A between the protective layer patterns 80 (as seen in FIG. 10 and FIG. 11) is selected so as to be different from either a contact hole width B of the first protective contact hole 47 or a contact hole width C of the first and second protective contact holes 48. In a preferred invention embodiment, the protective layer patterns 80 are formed by using polyimide.

According to the present invention described above, materials having mechanical intensity (strength) different from one another are formed in or along a scribe-line on a semiconductor substrate to create a scribe-line structure, so that, during performance of a cutting process on a semiconductor substrate, mechanical shock or cracking tendencies to a peripheral area of the scribe-line structure may be minimized. As a result, through the cutting process performed on the semiconductor substrate, the use of scribe-line structures according to this invention enables multiple semiconductor devices formed on the same substrate to be separated from one another and from unused semiconductor substrate while minimizing or eliminating damage to the semiconductor devices.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A method of forming scribe-line structures along a face of a semiconductor substrate, the method comprising the steps of:
   sequentially forming a lower layer and a molding layer on the semiconductor substrate;
   forming a photoresist layer on the molding layer, the photoresist layer having at least one opening therein;
   performing an etching process on the molding layer through the opening by using the photoresist layer as an etching mask to form at least a protective contact hole extending at least into the molding layer but without extending into the substrate;
   removing the photoresist layer from the semiconductor substrate; and
   sequentially forming a dielectric layer, an upper layer, and protective layer patterns in order on the molding layer so as to fill at least a bottom portion of the protective contact hole,
   wherein, the protective contact hole is formed to expose the lower layer without exposing the substrate, and also wherein the dielectric layer is formed by using material having a greater mechanical intensity than that of the molding layer.

2. The method according to claim 1, wherein the dielectric layer is formed by using a low-k material selected from the group consisting of Black Diamond, Coral, Aurora, and materials having dielectric constants similar thereto.

3. The method according to claim 1, wherein the dielectric layer is formed by using a composite low-k material comprising at least two members selected from the group consisting of Black Diamond, Coral, Aurora, and materials having dielectric constants similar thereto.

4. The method according to claim 1, wherein the dielectric layer is formed by using a composite lower-k material comprising at least two members selected from the group consisting of Nanoporous silicate, BCB, Flare, ALCAP, LKD, and materials having dielectric constants similar thereto, and a composite low-k material comprising at least two members selected from the group consisting of Black Diamond, Coral, Aurora, and materials having dielectric constants similar thereto, the lower-k material and the low-k material being formed to be stacked in turn.

5. The method according to claim 1, wherein the molding layer is formed by using a lower-k material selected from the group consisting of Nanoporous silicate, BCB, Flare, ALCAP, LKD, and materials having dielectric constants similar thereto.

6. The method according to claim 1, wherein the lower layer is formed by using a material having a greater mechanical intensity than that of the dielectric layer.

7. A method of forming scribe-line structures along a face of a semiconductor substrate, the method comprising the steps of:
sequentially forming a lower layer, a pad layer, and a molding layer on the semiconductor substrate;
forming a photoresist layer on the molding layer, the photoresist layer having at least one opening therein;
performing an etching process on the molding layer and the pad layer through the opening by using the photoresist layer as an etching mask to form at least a protective contact hole extending at least into the pad layer but without extending into the substrate;
removing the photoresist layer from the semiconductor substrate; and
sequentially forming a dielectric layer, an upper layer, and protective layer patterns on the molding layer so as to fill at least a bottom portion of the protective contact hole,
wherein, the protective contact hole is formed to expose the lower layer without exposing the substrate, and also wherein the dielectric layer and the pad layer are formed by using a material or materials having a greater mechanical intensity than that of the molding layer.

8. The method according to claim 7, wherein the dielectric layer and the pad layer are formed by using a low-k material selected from the group consisting of Black Diamond, Coral, Aurora, and materials having dielectric constants similar thereto.

9. The method according to claim 7, wherein the dielectric layer and the pad layer are formed by using a composite low-k material comprising at least two members selected from the group consisting of Black Diamond, Coral, Aurora, and materials having dielectric constants similar thereto.

10. The method according to claim 7, wherein the dielectric layer is formed by using a low-k material selected from the group consisting of Black Diamond, Coral, Aurora, and materials having dielectric constants similar thereto, and the pad layer is formed by using a lower-k material selected from the group consisting of Nanoporous silicate, BCB, Flare, ALCAP, LKD, and materials having dielectric constants similar thereto.

11. The method according to claim 7, wherein the dielectric layer is formed by using both a low-k material selected from the group consisting of Black Diamond, Coral, Aurora, and materials having dielectric constants similar thereto, and a lower-k material selected from the group consisting of Nanoporous silicate, BCB, Flare, ALCAP, LKD, and materials having dielectric constants similar thereto, the low-k material and the lower-k material being stacked in turn, further wherein the pad layer is formed by using a composite lower-k material comprising at least two members selected from the group consisting of Nanoporous silicate, BCB, Flare, ALCAP, LKD, and materials having dielectric constants similar thereto.

12. The method according to claim 7, wherein the lower layer is formed by using a material having a greater mechanical intensity than that of either the dielectric layer or the pad layer.

13. A method of forming scribe-line structures along a face of a semiconductor substrate, the method comprising the steps of:
sequentially forming a lower layer, a pad layer, and a molding layer on the semiconductor substrate;
forming a photoresist layer on the molding layer, the photoresist layer having at least one opening therein;
performing an etching process on the molding layer through the opening by using the photoresist layer as an etching mask to form at least a protective contact hole extending at least into the molding layer but without extending into the substrate;
removing the photoresist layer from the semiconductor substrate; and
sequentially forming a dielectric layer, an upper layer, and protective layer patterns in order on the molding layer so as to fill at least a bottom portion of the protective contact hole,
wherein, the protective contact hole is formed to expose the pad layer without exposing the substrate, and also wherein the dielectric layer and the pad layer are formed by using a material or materials having a greater mechanical intensity than that of the molding layer.

14. The method according to claim 13, wherein the dielectric layer and the pad layer are formed by using a low-k material selected from the group consisting of Black Diamond, Coral, Aurora, and materials having dielectric constants similar thereto.

15. The method according to claim 13, wherein the dielectric layer and the pad layer are formed by using a composite low-k material comprising at least two members selected from the group consisting of Black Diamond, Coral, Aurora, and materials having dielectric constants similar thereto.

16. The method according to claim 13, wherein the dielectric layer is formed by using a low-k material selected from the group consisting of Black Diamond, Coral, Aurora, and materials having dielectric constants similar thereto, and the pad layer is formed by using a lower-k material selected from the group consisting of Nanoporous silicate, BCB, Flare, ALCAP, LKD, and materials having dielectric constants similar thereto.

17. The method according to claim 13, wherein the dielectric layer is formed by using both a low-k material selected from the group consisting of Black Diamond, Coral, Aurora, and materials having dielectric constants similar thereto, and a lower-k material selected from the group consisting of Nanoporous silicate, BCB, Flare, ALCAP, LKD, and materials having dielectric constants similar thereto, the low-k material and the lower-k material being stacked in turn, further wherein the pad layer is formed by using a composite lower-k material comprising at least two members selected from the group consisting of Nanoporous silicate, BCB, Flare, ALCAP, LKD, and materials having dielectric constants similar thereto.

18. The method according to claim 13, wherein the lower layer is formed by using a material having a greater mechanical intensity than that of either the dielectric layer or the pad layer.

* * * * *